United States Patent
Dong

(10) Patent No.: US 7,351,602 B2
(45) Date of Patent: Apr. 1, 2008

(54) PROCESS FOR PRODUCING A THIN FILM WITH MEMS PROBE CIRCUITS

(76) Inventor: Wen-Chang Dong, No.15-4, Manping 2nd St., Banciao City, Taipei County (TW) 220

(*) Notice: Subject to any disclaimer, the term of this patent is extended or adjusted under 35 U.S.C. 154(b) by 264 days.

(21) Appl. No.: 11/319,632

(22) Filed: Dec. 29, 2005

(65) Prior Publication Data

US 2006/0148117 A1   Jul. 6, 2006

(51) Int. Cl.
*H01L 21/00* (2006.01)
(52) U.S. Cl. .............. 438/48; 438/52; 438/53; 438/54; 438/55; 257/E29.273
(58) Field of Classification Search ............ 438/48–55; 257/1
See application file for complete search history.

(56) References Cited

U.S. PATENT DOCUMENTS 5,467,020 A * 11/1995 Boyette et al. ............. 324/537
5,953,306 A *  9/1999 Yi .............................. 369/126

* cited by examiner

*Primary Examiner*—Walter Lindsay, Jr.
*Assistant Examiner*—Abdulfattah Mustapha
(74) *Attorney, Agent, or Firm*—Bacon & Thomas, PLLC

(57) ABSTRACT

A process for producing a thin film with MEMS probe circuits by using semiconductor process technology comprises steps of providing a flatted process substrate; forming a separable interface on the flatted process substrate; forming a probe circuit thin film with electric circuits, probes and circuit contacts on the separable interface; forming a raised probe supported-spacer on the probe circuit thin film; separating the probe circuit thin film from the process substrate; and processing a subsequent microstructure working to obtain a thin film with MEMS probe circuits which use the raised probe supported-spacer to form a buffer to prevent the probes from being exposed to much pressure.

7 Claims, 12 Drawing Sheets

PROCESS FOR PRODUCING A THIN FILM WITH MEMS PROBE CIRCUITS

BACKGROUND OF THE INVENTION

1. Field of the Invention

The present invention relates to a process for producing a thin film with MEMS probe circuits, and more particularly to a method of fabricating a flexible thin film integrated with various electrical circuits, plural probes and circuit contacts, a raised probe supported-spacer, and dielectric layers as a whole.

2. Description of the Prior Art

With the rapid development of the semiconductor technology, many consumed electronics products are getting smaller and smaller and provided with higher density of the integrated circuit as well as relevant electronic components, more pins, and shorter pin spacing. Moreover, due to the improvement on packaging technology, a contact is no longer arranged on the periphery of an integrated circuit but as an array. In the meantime, a contact pad, such as a tin ball or a gold bump, is used as material for contacts on a semiconductor surface, rather than a simple aluminum pad. Due to wireless communication times being coming, it means the electronic products are required for higher computation speed now. With a result, the difficulty is increased in implementation of high frequency tests and the development for the industry is then encountered some bottlenecks in capacity, cost, and future technology.

The structure of current wafer test card has been improved to solve the problems in test technology by increasing test speed, reducing test cost and reducing risk of misjudging good products. Therefore, the current wafer test card has developed from traditional cantilever probe cards to various vertical probe cards, rigid microelectro-mechanical systems (MEMS) probe cards and thin film test cards.

Difficulty in implementing an array test is improved substantially with the vertical probe card. However, the vertical probe card is expensive and difficult to make. Moreover, spacing above 100 μm is mainly used for the test of contact pads and it is difficult to create smaller spacing.

The kind of rigid MEMS probe used for rigid MEMS systems probe card is fabricated on a multi-layer ceramic substrate using semiconductor process technology. Difficulty in being arranged as an array and implementing high frequency tests has been removed by using the rigid MEMS probe card. However, since the rigid probe is inflexible and too much rigid, the contact pad of an item to be tested will be crushed easily if the contact pressure between the rigid probe and the contact pad is too high. Moreover, if a surface of the rigid probe or contact pad is uneven, the probe will not be easily in contact with the contact pad due to the inflexibility of the probe.

FIG. 1a shows the structure of a currently used thin film test card 20. A probe or metal bump 21 is fabricated on a contact which is placed on the surface of a flexible circuit thin film or a flexible circuit 28 of any kind.

Without a covered structure around the probe 21 to enhance strength, the probe 21 of the thin film test card 20 is attached to the surface of the flexible circuit 28 with the bottom of the probe 21 so that the structure of the probe 21 of the thin film test card 21 become is quite unstable at all. When exposed to pressure, as shown in FIG. 1b, the probe 21 will be easily crooked or sunken, which results in incorrect test results.

On the other hand, the probe 21 of the thin film test card 20 after being fabricated is usually installed in a protecting holder. However, since the circuit board 28 is so flexible and on the back surface opposite to the surface installed the probe 21 of the flexible circuit 28 is not provided with any supported blocks or fixing mechanism thereof, the probe 21 becomes crooked or uneven if the flexible circuit 28 is bent as shown in FIG. 1c, resulted in that the assembly of thin film test card 20 will be more difficult.

Since the probe 21 of the thin film card 20 has the above mentioned shortcomings in structure and is not easily arranged as an array, the availability of the thin film test card 20 for test purpose is limited and the test card 20 is only applicable to the test of products or panels with contact pads arranged around ICs.

SUMMARY OF THE INVENTION

The primary objective of the present invention is to provide a flexible thin film with MEMS probe circuit which is using semiconductor technology to form a one-piece structure integrated with various electrical circuits, plural probes and circuit contacts, a raised probe supported spacer, and dielectric layer as a whole, wherein the electronic circuits are all embedded inside the dielectric layer of the thin film; plural probes and circuit contacts are provided with one end embedded into the dielectric layer in connection with the electrical circuits respectively and the other end protruded out of the dielectric layer, and a raised probe supported-spacer disposed on the dielectric layer to form a buffer to the probes, so that the probes of the flexible thin film shall be covered and protected by the dielectric layer and shall be stable, straight, and not easily damaged.

Another objective of the present invention is to provide a process for producing the thin film, which by using semiconductor process technology comprises steps of: providing a flatted process substrate; forming a separable interface on the flatted process substrate; forming a probe circuit thin film with electric circuits; probes and circuit contacts on the separable interface; forming a raised probe supported-spacer on the probe circuit thin film; separating the probe circuit thin film from the process substrate; and processing a subsequent microstructure working to obtain a thin film with MEMS probe circuits.

Another objective of the present invention is to provide a MEMS probe head by combining a thin film with MEMS probe circuits with a test printed circuit board, which MEMS probe head is applicable to flip-chip substrate tests, bare die tests, liquid crystal display panel tests.

DETAILED DESCRIPTION OF THE INVENTION

Figure 1:
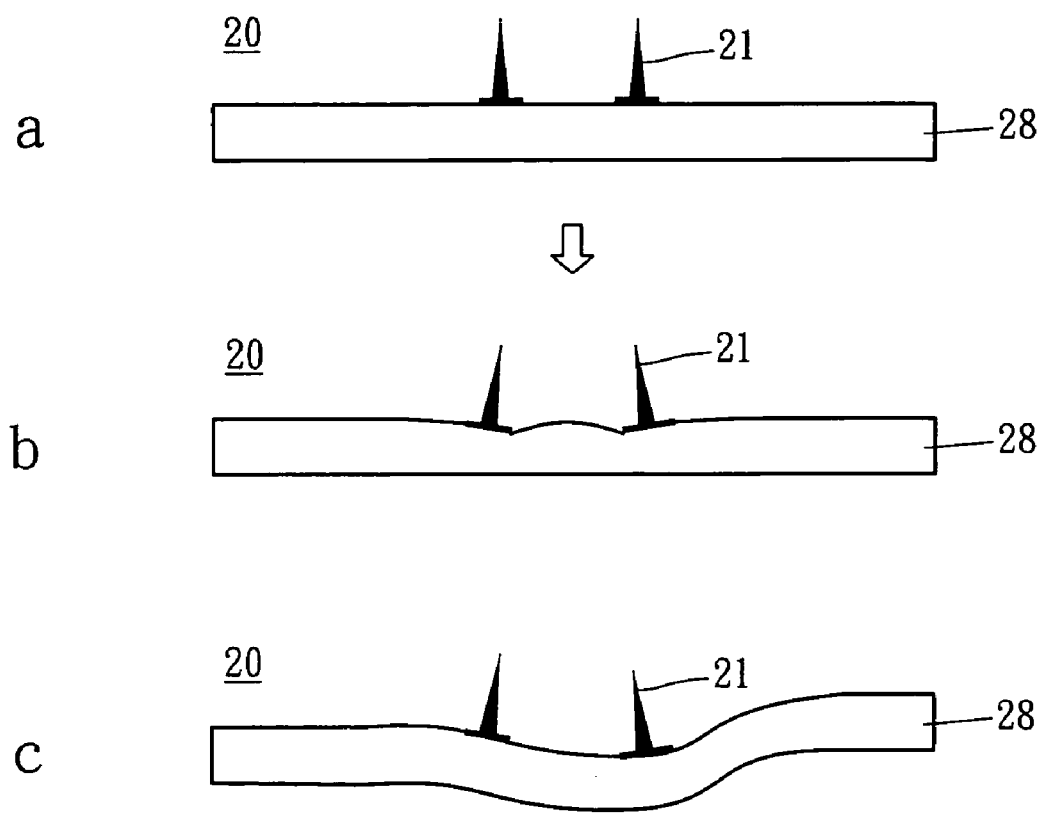
FIG. 1 is a structural diagram of a kind of conventional thin film test card to show the thin film test card is easily sunken if probes of the test card are exposed to pressure.

As shown in FIGS. 2a to 2f, a thin film 100 with microelectro-mechanical systems (MEMS) probe circuits of the invention is an one-pieced flexible thin film which is by using semiconductor process technology stacked with multi-layered flexible non-conducting dielectric materials 31 (or called dielectric layers 31) to have the one-pieced flexible thin film 100 of the invention integrated with plural probes 32, electrical circuits 33, circuit contacts 34, a probe supported-spacer 35, and dielectric layer(s) 31 as an integral structure.

Since the thin film 100 with MEMS probe circuits of the invention is fabricated by using semiconductor process technology, various kinds of multi-layered thin films with different functions can be fabricated as an integral structure in accordance with any requirements and purpose. However, each thin film 100 with MEMS probe circuits of the invention has an identical basic structural feature, i.e., which is integrated with plural probes 32, electrical circuits 33, circuit contacts 34, a probe supported-spacer 35, and dielectric layer(s) 31 to form an one-pieced structure. Moreover, as shown in FIGS. 2a to 2f, the electrical circuit 33 is embedded in the dielectric layer 31; the probes 32 and circuit contacts 34 are embedded in the dielectric layer 31 to form an electrical connection to the electrical circuit 33, and each one end of the probes 32 and the circuit contacts 34 are protruded out of the thin film 100; particularly, the probe supported-spacer 35 with function to support the probes is protruded from and disposed on the backside opposite to the side of the thin film 100 protruding out of the end of the probes 32.

The primary purpose for installing the probe supported-spacer 35 disposed on the thin film 100 with MEMS probe circuits of the invention is to fix and support the probes 32 and keep the probes 32 always in flat state, and the secondary purpose for installing the probe supported-spacer 35 is to provide flexibility as well as convenience for assembly, make the assembled probes 32 capably higher than other surfaces, and form a buffer for the probes 31.

Figure 2A:
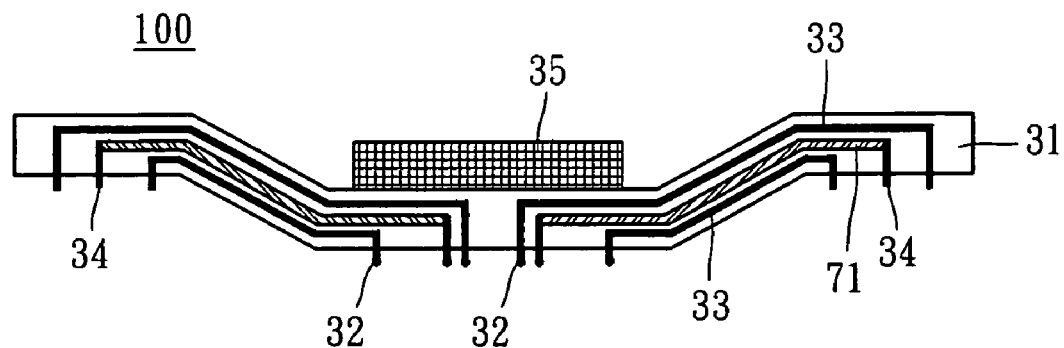
FIGS. 2a to 2f are several kinds of structural diagrams of a thin film with MEMS probe circuit of the present invention to show the invented flexible and one-piece thin film of the present invention using semiconductor technology integrated with plural probes, electrical circuits, circuit contacts, a probe supported-spacer, and dielectric layer as a whole.

Metals, such as copper, gold, aluminum, tungsten, silver, or an alloy thereof, can be used for an electrical circuit 33 embedded inside the thin film 100 with MEMS probe circuits of the invention. Metals, such as nickel, chromium, titanium, platinum, beryllium, or an alloy thereof, can serve as a protection layer for covering a circuit lead. Moreover, various kinds of electrical circuit 33 with any different functional components may be embedded and arranged into the dielectric layer(s) 31 of the thin film 100. For example, as shown in FIG. 2c, a capacitor 55 and a resistance 56 are added in the electrical circuit 33 to increase circuit functions of the thin film 100 with MEMS probe circuits of the invention when designing the electrical circuit 33. As shown in FIG. 2a or FIG. 2d, an electrical circuit 33 may be arranged as a multi-layered circuit layout depending on your requirements. Moreover, as shown in FIG. 2a, a grounding layer 71 may be fabricated for a multi-layered electrical circuit 33 to avoid electrical interference.

The circuit contacts 34 of the thin film 100 with MEMS probe circuits of the invention may or may not pass through the thin film 100 in accordance with your requirements.

Figure 2B:
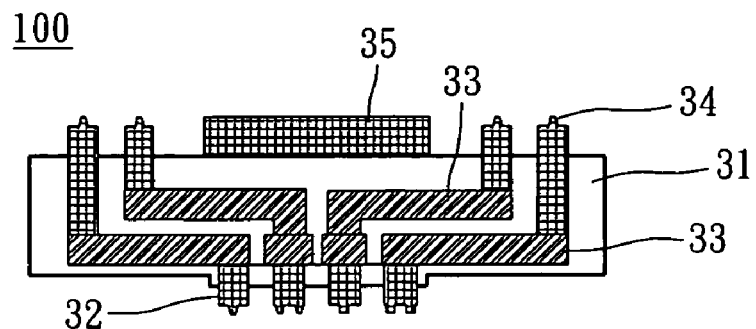
Figure 2C:
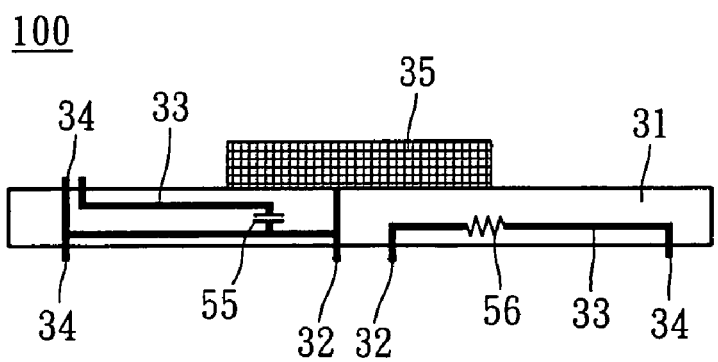
Figure 2D:
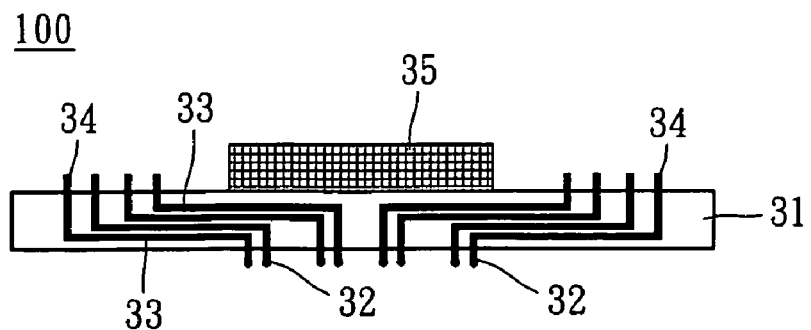
Figure 2E:
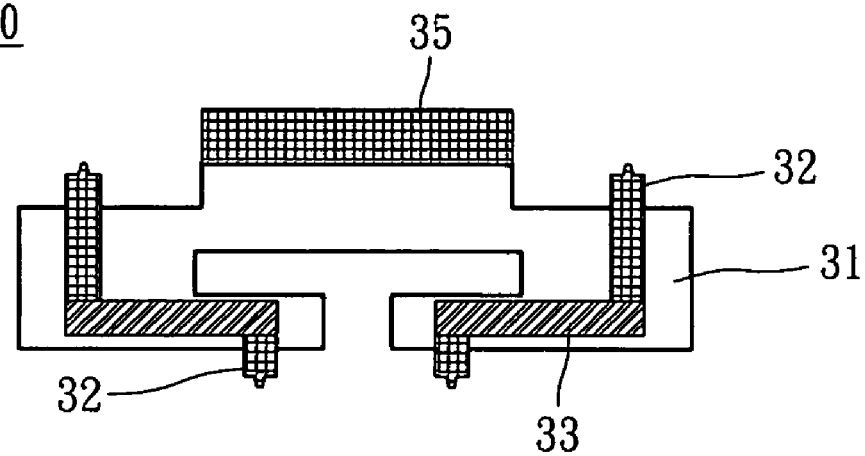
Figure 2F:
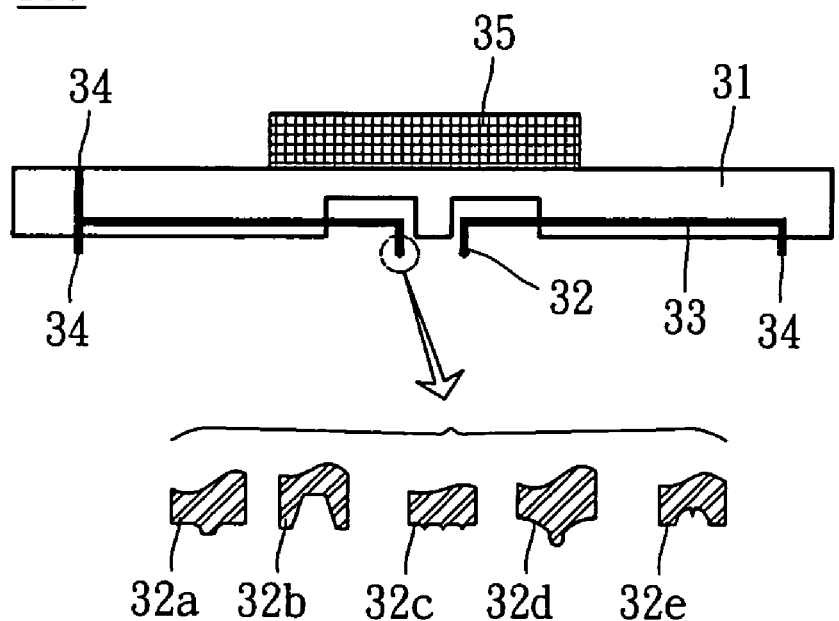

The probes 32 of the thin film 100 with MEMS probe circuits of the invention is capably fabricated into a vertical probe as shown in FIG. 2b, or a cantilever probe as shown in FIG. 2e in accordance with your requirements. Moreover, the head of the probe 32 as shown in FIG. 2f is capably fabricated into a mosaic head 32a or 32b, an embedded head 32c or 32d, or a hybrid head 32e. The head of the probe 32 may be formed on the same side with or on the opposite side to that of the circuit contact 34 of the thin film 100 with MEMS probe circuits of the invention.

Metals, such as tungsten, nickel, chromium, gold, or an alloy thereof, may be used as the material for the probe(s) 32, and technologies, such as electroplating, chemical plating, chemical vapor deposition, and sputtering, may be used to cover the probe(s) 32 with other metals, such as chromium, rhodium, platinum, titanium, and beryllium copper.

Particularly, the rear ends of the probes 32 and the circuit contacts 34 of the thin film 100 with MEMS probe circuits of the invention are embedded in the dielectric layer(s) 31 and tightly covered with the dielectric layer(s) 31; thereby, the dielectric layers(s) 31 of the thin film 100 with MEMS probe circuits of the invention is not only a stable structure to cover the probe(s) 32 and the circuit contact(s) 34, but a protection structure to prevent the probe(s) 32 and the circuit contact(s) 34 from damage.

Figure 3:
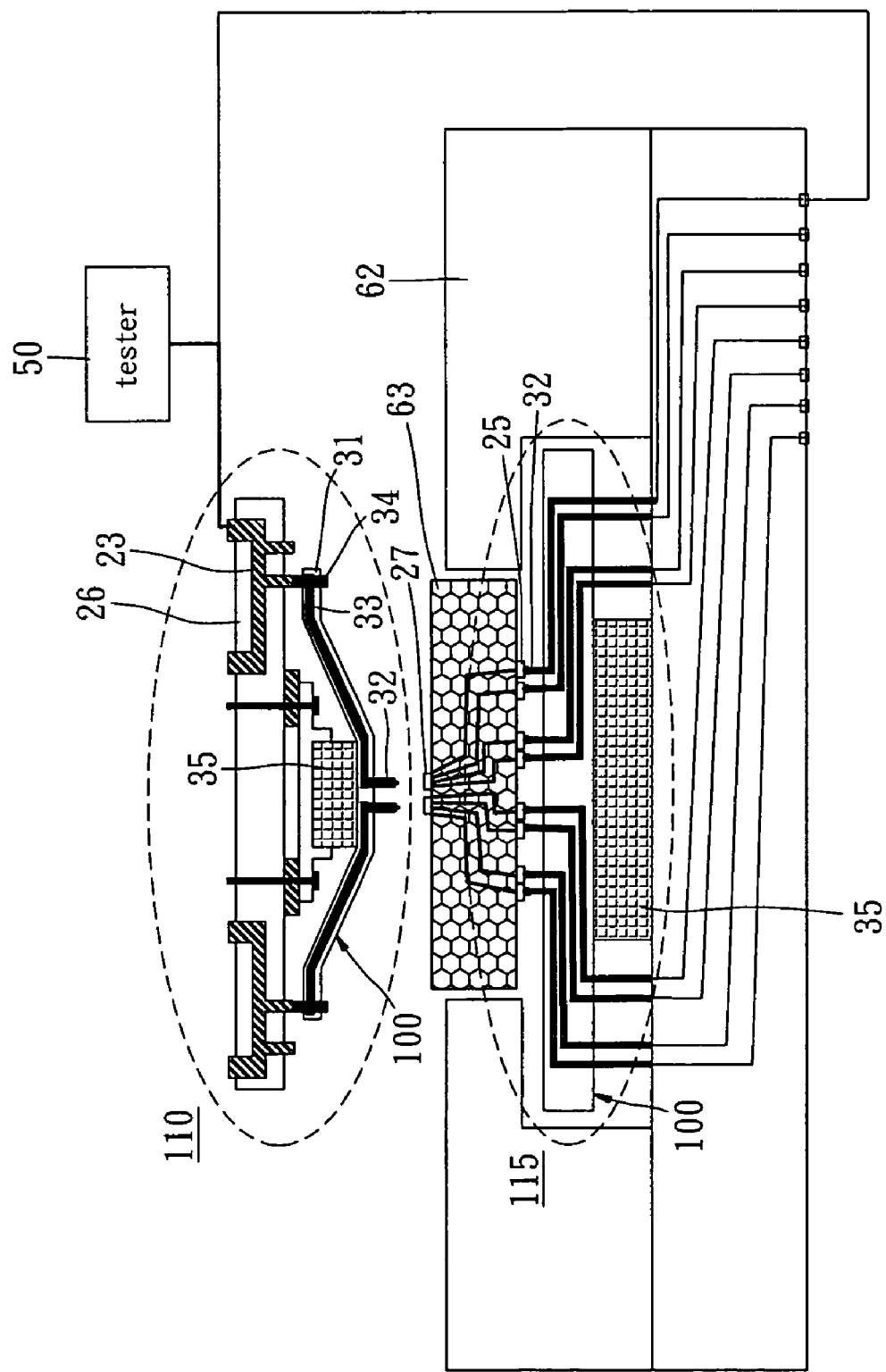
FIG. 3 shows a thin film with MEMS probe circuit of the present invention being applicable for flip-chip substrate tests.

Furthermore, the probes 32 of the thin film 100 with MEMS probe circuits are capably arranged as an array through multi-layered electric circuits 33. As shown in FIG. 3, when the thin film 100 with MEMS probe circuits of the invention and a printed circuit 26 are assembled into a MEMS thin film probe head 110, the kind of MEMS thin film probe head 110 with a probe supported-spacer 35 to support the probes 32 kept in flat state shall be used for various advanced flip-chip substrate tests.

Figure 4A:
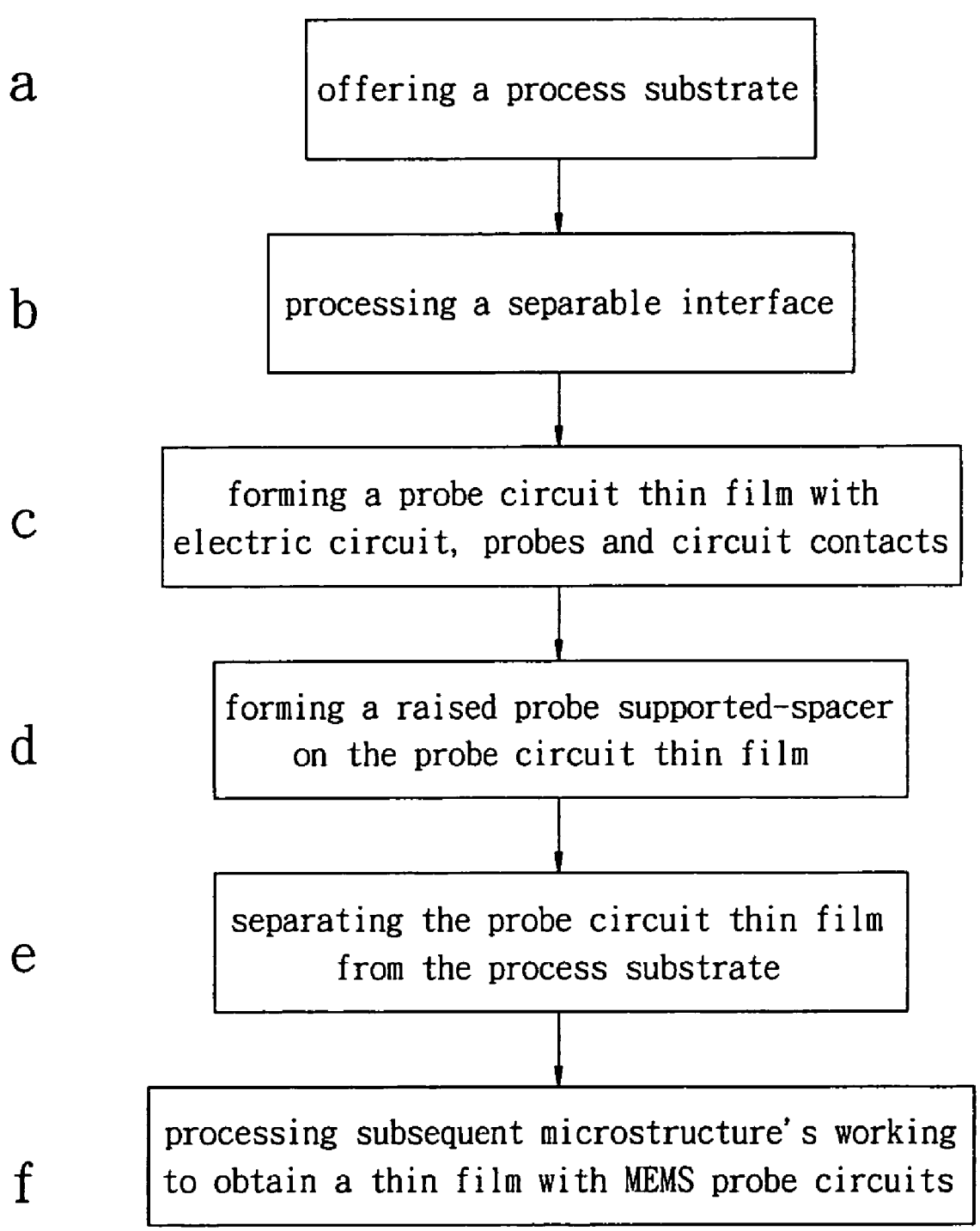
FIGS. 4a to 4b show a process for producing one-piece thin film with MEMS probe circuits of the present invention.
Figure 4B:
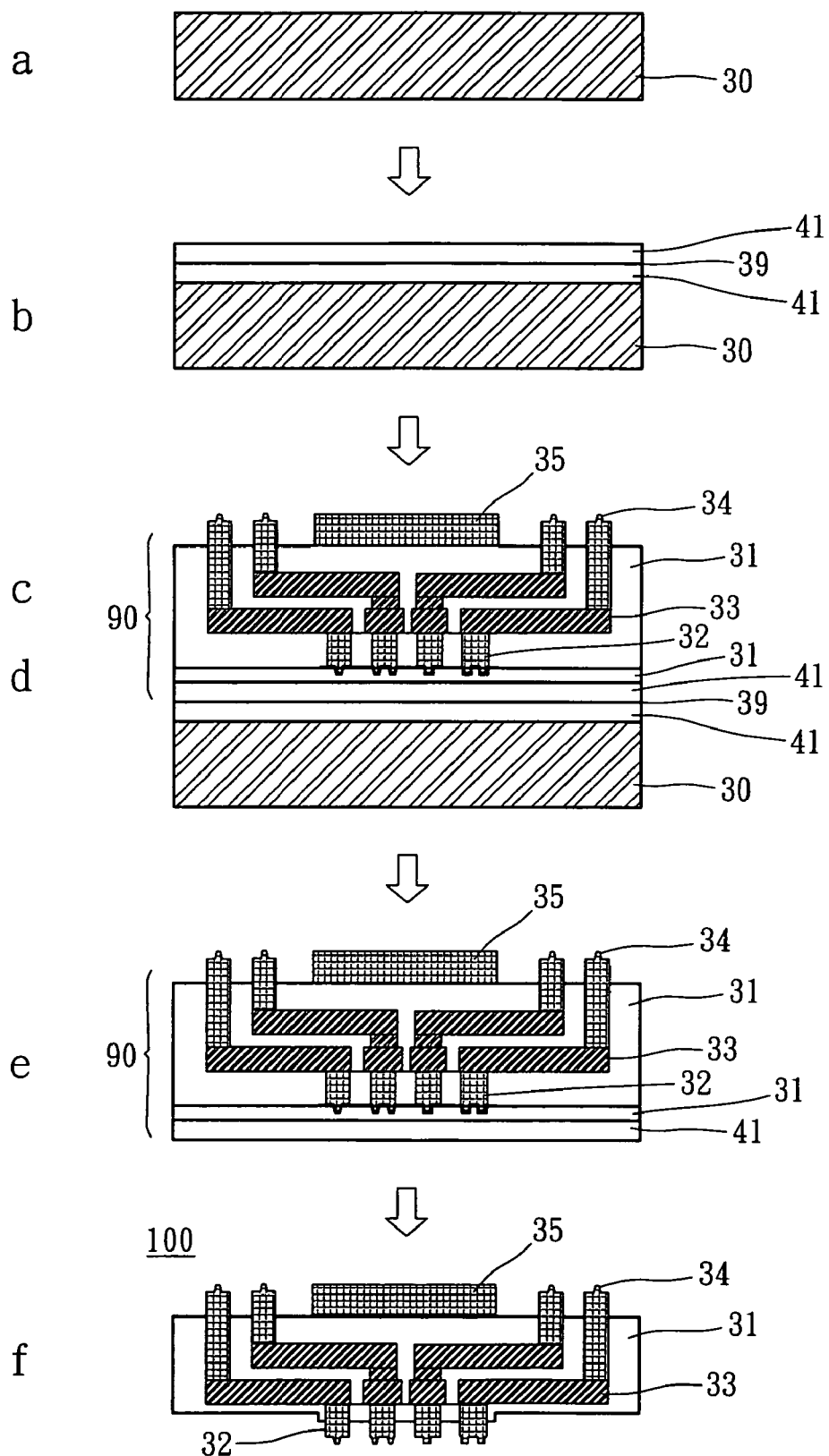

As shown in FIG. 4a and FIG. 4b, the process for producing the thin film 100 with MEMS probe circuits of the present invention is applied to semiconductor process technologies including the removing technology and stacking technology applied for the dielectric layer and metal circuit layer, metal and non-metal growth, photo-resist and lithograph technologies, picture transforming technology, chemical mechanical polishing (CMP) technology and ion implantation technology.

Thus, a kind of thin film 100 made and obtained from the invented process of the invention shall be an one-pieced flexible thin film 100 with MEMS probe circuits which is embedded various kinds of electric circuits 33 inside a flexible multi-layered dielectric layers 31 and particularly integrated those microstructures of vertical or cantilever probes 32, circuit contacts 34 and probe supported-spacer 35 together with the dielectric layers 31 having the electric circuits 33 inside as an integral structure.

The process for producing the thin film 100 with MEMS probe circuits of the present invention comprises steps of:

(a) providing a process substrate 30;

Since the thin film 100 with MEMS probe circuits of the present invention is flexible, a flat and rigid substrate should be selectively used as a process substrate 30 for using semiconductor process technology to produce the thin film 100 with MEMS probe circuits and to prevent the thin film 100 with MEMS probe circuits (hereinafter referred to as probe circuit thin film 90) from bending, expanding, or distorting during the process.

A flatted substrate, such as a ceramic, silicon, quartz and aluminum alloy, may be used as the process substrate 30 of the present invention.

(b) processing a separable interface 39 to be used to separate the process substrate 30 in the subsequent process;

Although the flatted process substrate 30 is required to prevent the probe circuit thin film 90 from bending, expanding, or distorting during the process, the probe circuit thin film 90 must be separated from the process substrate 30 in the subsequent process. Various separable interfaces should be formed between the process substrate 30 and the probe circuit thin film 90 in advance for separating the process substrate 30 from the probe circuit thin film 90 in the subsequent process.

There are two ways to form the required separable interface 39. First way to form a separable interface is to control the adhesion of interface between two layers such as by forming a bad adhesion between two layers. As shown in FIG. 4b, two layers of polyimide (PI) 41 are applied on the surface of the process substrate 30. When applying the first layer of polyimide 41, an adhesive is added and temperature and time for hard baking and solidification will be properly controlled. However, when applying the second layer of polyimide 41, no adhesive is added and the temperature and time for hard baking and solidification will be properly controlled. When doing so, the adhesion between the first layer of polyimide 41 and the second layer of polyimide 41 will be bad to form a separable interface 39.

Second way to form a separable interface is to add an easily removable material between the process substrate 30 and the probe circuit thin film 90.

(c) forming a probe circuit thin film 90 with the prefabricated electrical circuit(s) 33, probe(s) 32 and circuit contact(s) 34 on the separable interface 39 after the step (b) is completed;

As shown in FIG. 4b, after a dielectric layer 31 is formed on the interface 39 of the process substrate 30, various grooves are capably formed on each stacked dielectric layer 31 by using the semiconductor process technologies including the dielectric layer stacked technology, metal circuit layer formed technology, metal and non-metal growth and removing technology, photo-resist and lithograph technologies and picture transforming technology applied to each stacked dielectric layer 31. After metal materials are filled into the groove formed on each stacked dielectric layer 31, various patterns prefabricated on the metal materials are formed using photo-resist and lithograph technologies and then the metal materials are processed according to etching or electroplating process to make the probe circuit thin film 90 provided with electric circuit(s) 33 inside the dielectric layer(s) 31 and some microstructures of the probes 32 or/and circuit contacts 34 electrically connected with the electric circuits 33 respectively.

Figure 5B:
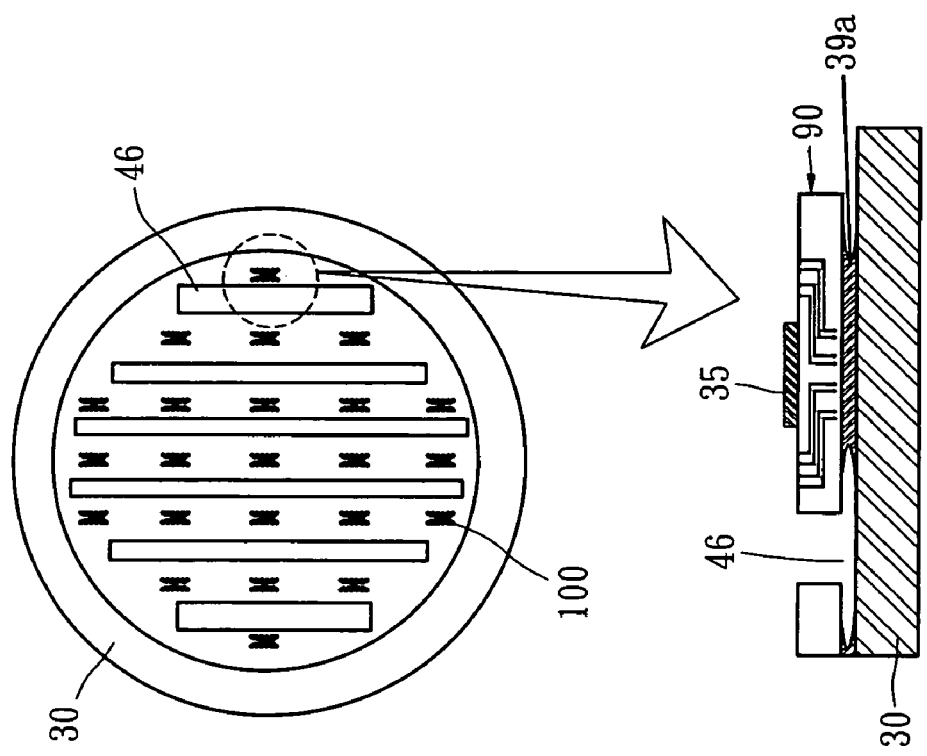
FIGS. 5a to 5b show a thin film with MEMS probe circuits has being separated from a process substrate that will not bend, expand, or distort during the process.
Figure 5A:
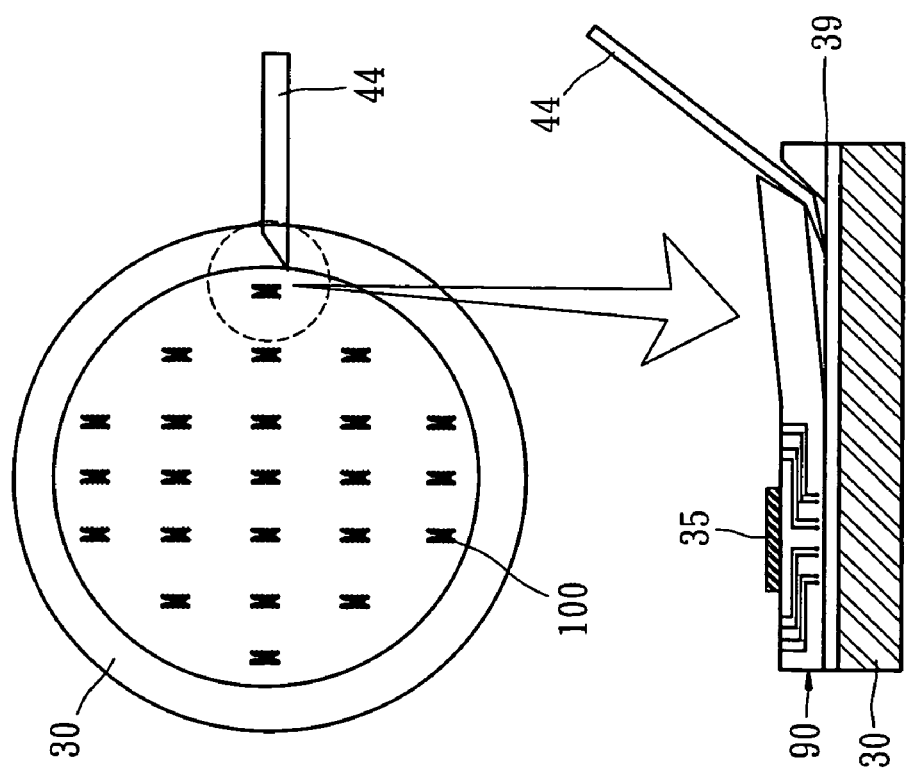

(d) forming a raised probe supported-spacer 35 on the probe circuit thin film 90 after the step (c) of the probe circuit thin film 90 is completed;

The probe circuit thin film 90 has a raised probe supported-spacer 35 to support and fix the probes 32 and keep the probes 32 in flat;

(e) separating the probe circuit thin film 90 from the process substrate 30 by destroying the separable interface 39 between the process substrate 30 and the probe circuit thin film 90;

As shown in FIG. 5a, the separable interface 39 is formed by a bad adhesion between the process substrate 30 and the probe circuit thin film 90; thereby, the process substrate 30 and the probe circuit thin film 90 can be separated with a steel knife 44 cutting in a slant angle.

Or, as shown in FIG. 5b, a separable interface 39b between the process substrate 30 and the probe circuit thin film 90 is formed by adding an easily removable material. A plurality of the openings leading to the surface of the separable interface 39b is fabricated to let the etchant permeate and etch horizontally until the process substrate 30 and the probe circuit thin film 90 are separated.

(f) processing subsequent microstructure's working to the probe circuit thin film 90 to obtain a thin film 100 with MEMS probe circuits.

After the process substrate 30 and the probe circuit thin film 90 are separated, the microstructures of the probe circuit thin film 90 will be processed, including making the microstructures exposed by removing unnecessary materials or refining the microstructures; thereby, the probe circuit thin film 90 will be processed into a flexible thin film 100 with MEMS probe circuits.

Figure 6:
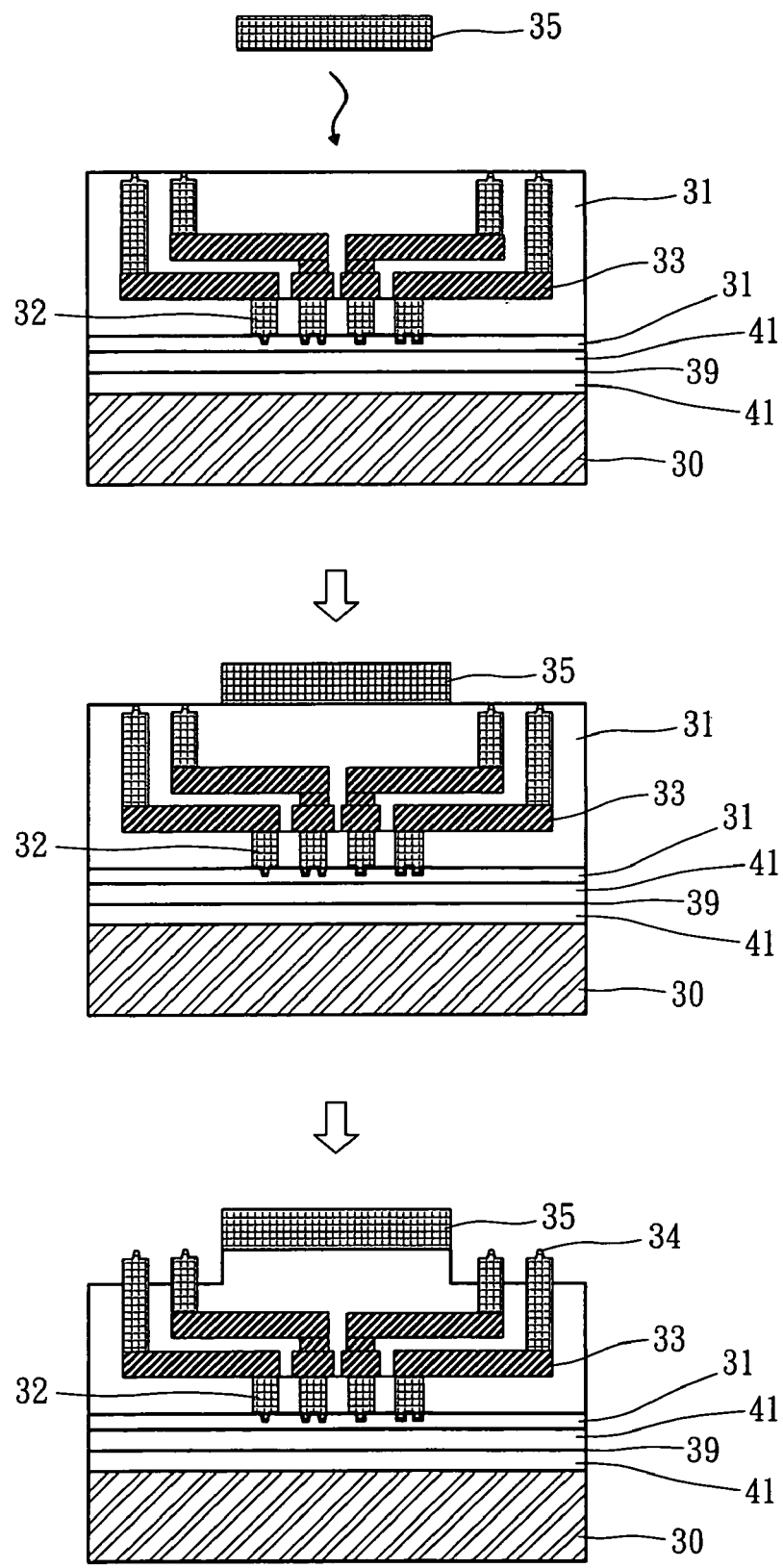
FIG. 6 to FIG. 10 shows another method of fabricating a probe supported-spacer to a thin film with MEMS probe circuits.

When a probe supported-spacer 35 is fabricated for the probe circuit thin film 90 in the step (e), one of a ceramic, silicon, silicide, glass, quartz, rubber, plastics, compounds, such as epoxy, polymers, metal or an alloy thereof, and even a stacked compounds may be used as the material for the probe supported-spacer 35; the methods of fabricating probe supported-spacer 35 include:

1. Before destroying the separable interface 39 in the step (e) or proceeding to the step (f), attach a prefabricated probe supported-spacer 35 to the probe circuit thin film 90;

As shown in FIG. 6, attach the probe supported-spacer 35, such as a silicon plate, ceramics plate, rubber pad, or metal plate, to a surface of a probe circuit thin film 90 using various adhesion technologies before a process substrate 30 and a probe circuit thin film 90 are separated or proceeding to the step (f).

Moreover, a rigid or flexible adhesive or material may be used to attach the probe supported-spacer 35 to the surface of the probe circuit thin film 90 so that the probe 32 has a rigid or flexible characteristic, and various test requirements are met.

Figure 7:
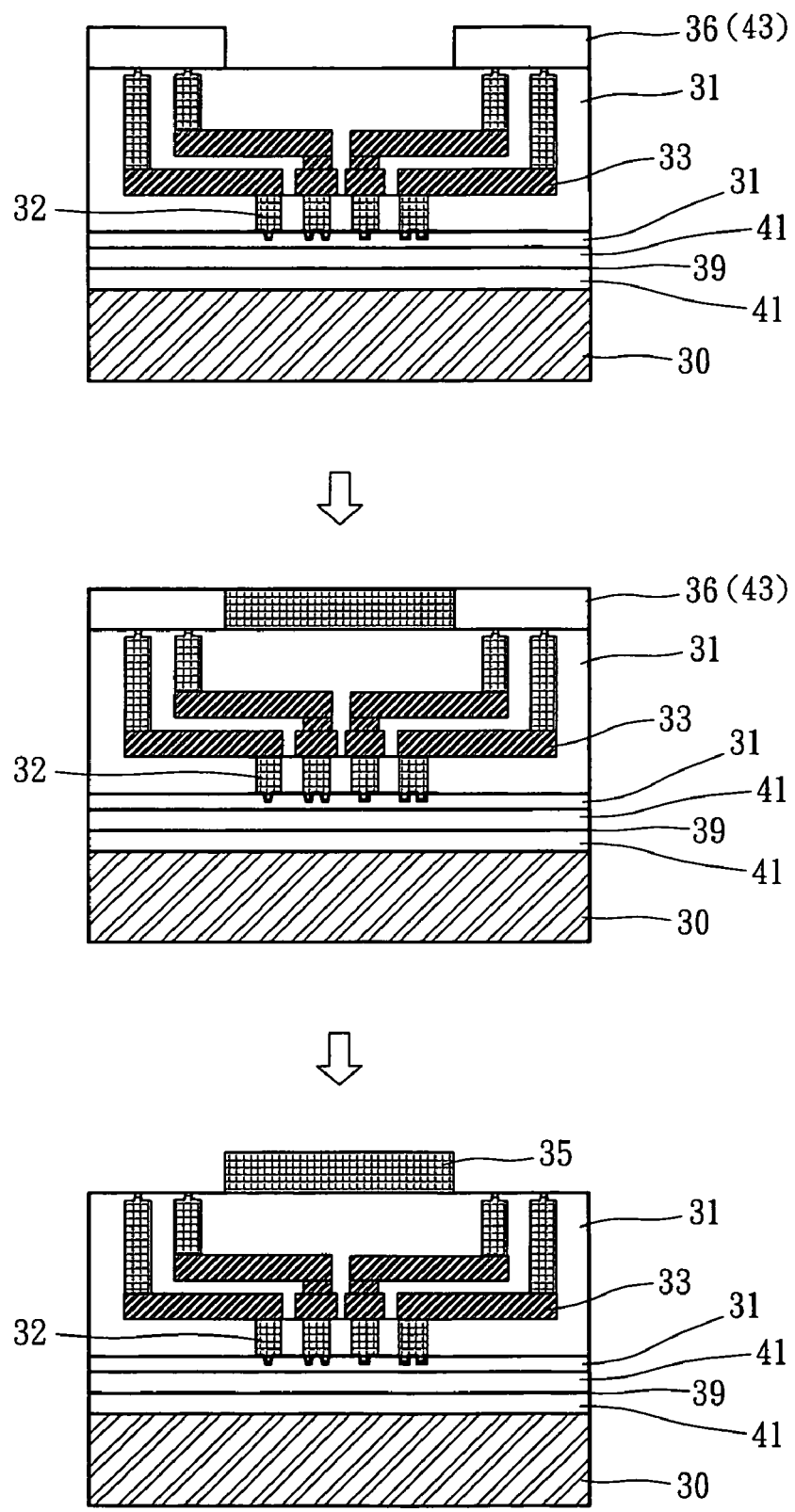

2. Before a separable interface 39 is removed, grooves are formed with a photoresist material and fill the material to form a probe supported-spacer 35 into the grooves;

As shown in FIG. 7, grooves and the area for a probe supported-spacer 35 are formed with a photoresist 36 using the lithograph technology before a separable interface 39 is removed. Then, the material used to form a probe supported-spacer 35, such as nickel, cobalt, copper and gold, is filled into the grooves, and when the photoresist 36 is removed the probe supported-spacer 35 is then left.

3. Before destroying a separable interface 39 in the step (e), fill a material used to form a probe supported-spacer 35 into the grooves on a halftone using halftone technology;

As shown in FIG. 7, before the separable interface 39 is removed, a halftone 43 will be attached to a surface of the probe circuit thin film 90. Then, the material used to form the probe supported-spacer 35, such as rubber or epoxy, will be filled into holes on a halftone 43, which will be removed to have the probe supported-spacer 35 left later.

Figure 8:
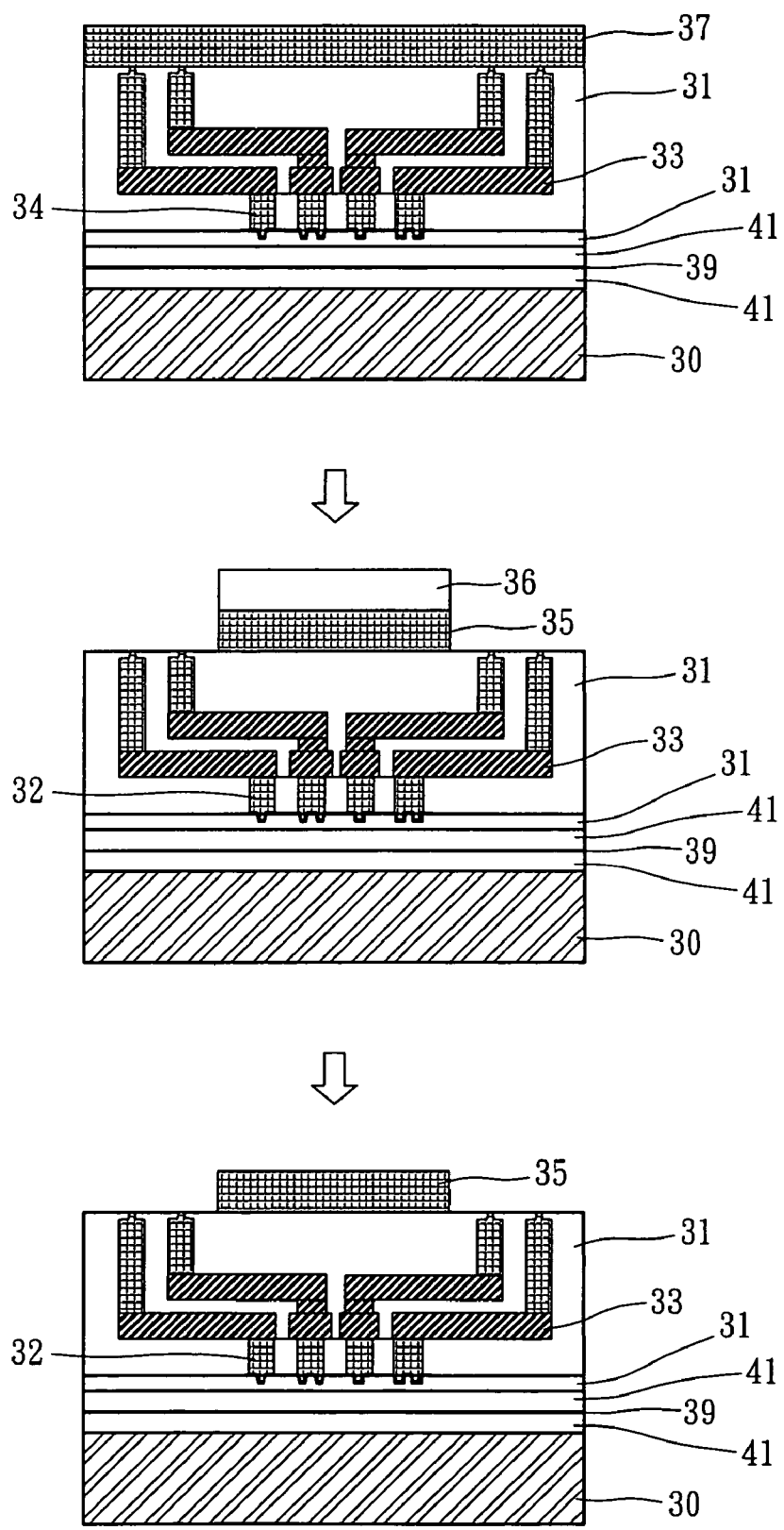

4. Before destroying a separable interface 39 in the step (e), fabricate a supported-spacer layer 37 in advance and remove unnecessary parts to fabricate a probe supported-space 35;

As shown in FIG. 8, before the separable interface 39 is removed, various flexible materials or metal materials are used to prefabricate the supported-spacer layer 37 in advance and the photoresist 36 is used to define the area of the probe supported-spacer 35 using lithograph technology. After the unnecessary parts are removed and the probe supported-spacer 35 is formed, the photoresist 36 will be removed to have the probe supported-spacer 35 left.

Figure 9:
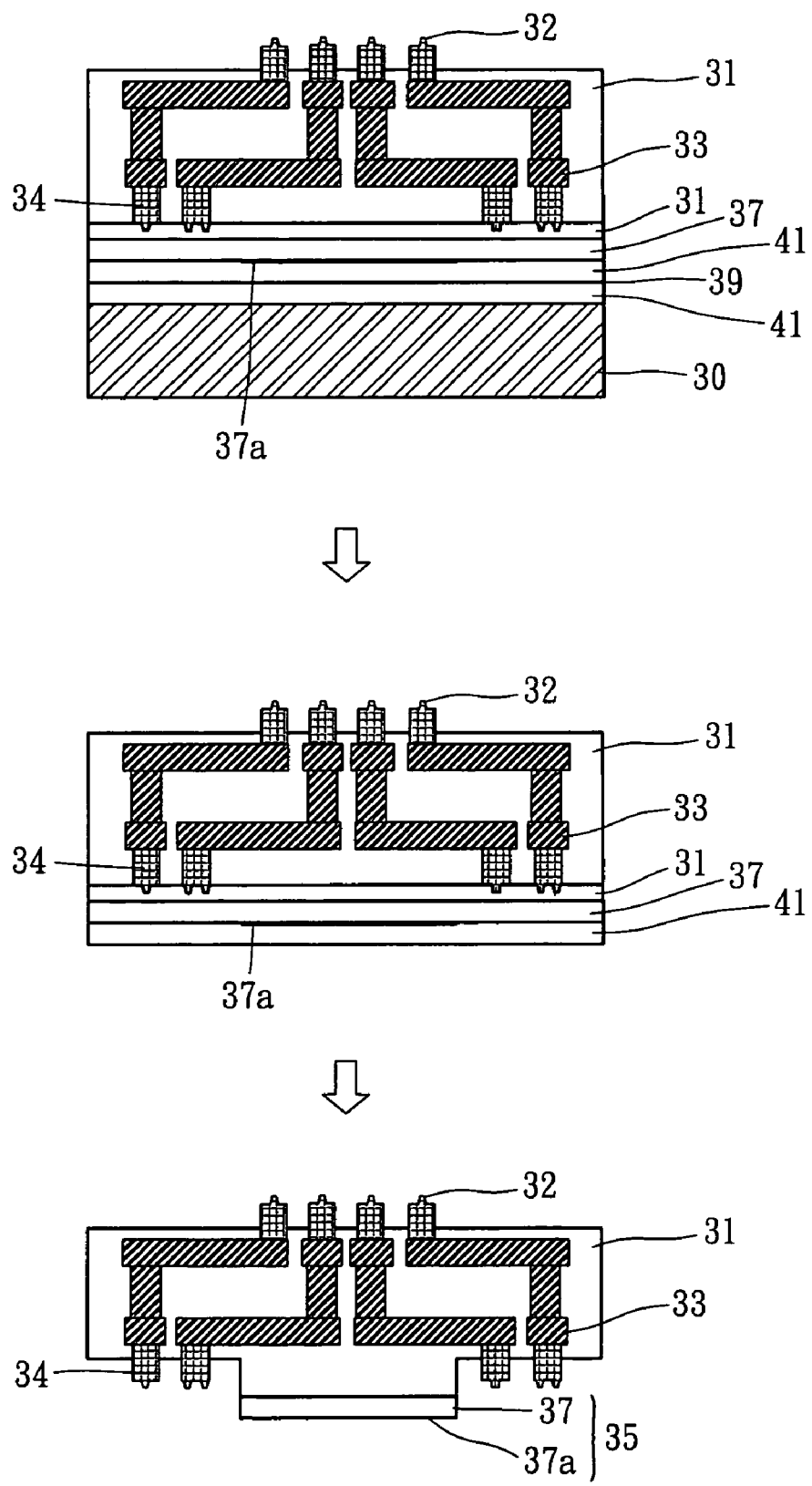

5. Fabricate a probe supported-spacer 37 in advance and remove the unnecessary parts before proceeding to the step (f) and then fabricate a probe supported-spacer As shown in FIG. 9, a supported-spacer layer 37 is prefabricated on a probe circuit thin film 90 and an etching mask 37 is retained to define the area of the probe supported-spacer 35. When the probe circuit thin film 90 and a process substrate 30 are separated and the step (f) is proceeding, the unnecessary parts of the supported-spacer layer 37 are removed using the etching mask 37a to fabricate a probe supported-spacer 35.

Figure 10:
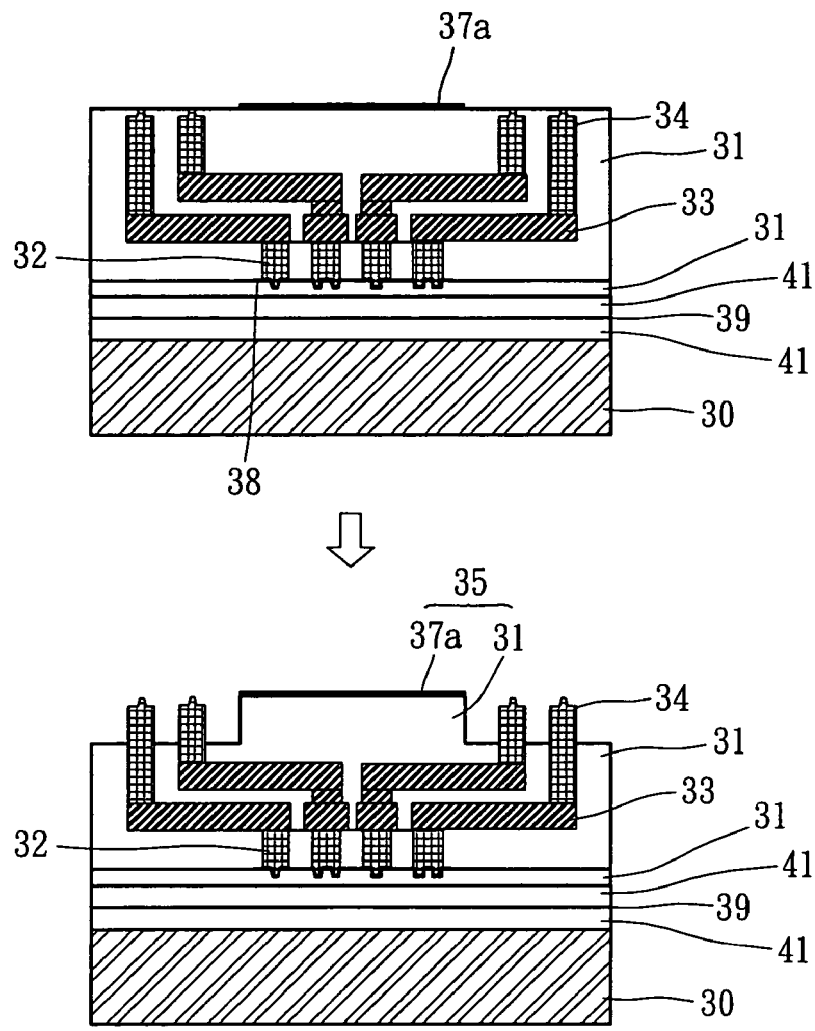

6. If a dielectric layer 31 of a probe circuit thin film 90 is used as a supported-spacer layer, a probe supported-spacer 35 of a probe circuit thin film 90 may be formed by removing the unnecessary parts before destroying a separable interface 39 in the step (e) and proceeding to the step (f);

As shown in FIG. 10, a dielectric layer 31 of the probe circuit thin film 90 is used as a supported-spacer layer. An etching mask 37a is used to remove the dielectric layer 31 with a probe supported-spacer 35 left before destroying the separable interface 39. Moreover, the etching mask 37a may or may not be removed.

The etching mask 37a is retained in the dielectric layer 31 to define the area for the probe supported-spacer 35 when processing the probe circuit thin film 90.

A thin film 100 with MEMS probe circuits of the invention has following advantages when fabricated using the above-mentioned process:

1. The electric circuits 33 with electric resistance, capacitance, inductance, or other electric components and the MEMS components including plural probes 32 or/and circuit contacts 34 shall be integrated as an integral structure to obtain an one-pieced flexible thin film with MEMS probe circuits.
2. The thin film 100 with MEMS probe circuits with a flat process substrate 30 shall not bend, expend, or distort in the manufactured process so that the final product of thin film 100 with MEMS probe circuits is very flat.
3. The probe(s) 32 and circuit contact(s) 34 can be arranged on one side or both sides of the thin film 100 with MEMS probe circuits so that the thin film 100 can be used widely.
4. Most body of the probe 32 even protruded out of the thin film 100 is covered and protected by the dielectric layer 31 to make the probe 32 constituted an integral structure with the thin film 100 so that the probe 32 of the thin film 100 is so stable and straight and not easily damaged.
5. Electric circuits 33 may be formed as multi-layered structure inside the thin film 100 with MEMS probe circuits so that the space distanced between probes 32 can be spaced less than 20 μm and the probes 32 can be arranged in a high density and an array manner.
6. A grounding layer can be fabricated between two electric circuits 33 to prevent electrical interference so that a high-frequency electrical circuit 33 can be fabricated.
7. The thin film 100 with MEMS probe circuits has contained a probe supported-spacer 35 structure before the thin film 100 is separated from the process substrate 30 so that the thin film 100 can keep flat with the probe 32 and the difficulty in assembly will be decreased.
8. The thin film 100 with MEMS probe circuits contains a flexible probe supported-spacer 35 to form a flexible buffer to the probes 32. When the probe 32 is exposed to pressure, pressure will be transferred to and absorbed by the probe supported-spacer 35 so that the probe 32 of the thin film 100 is very durable.
9. The probe 32 of the thin film 100 with MEMS probe circuits can have a rigid or flexible characteristic by using a rigid or flexible adhesive and the probe supported-spacer 35 to meet various test requirements.

As to applications, as shown in FIG. 3, the electric circuit 33 of the thin film 100 with MEMS probe circuits of the present invention can be connected to the circuit 23 of a test printed circuit board 26 to integrate into a kind of MEMS thin film probe head 110; thereby, the MEMS thin film probe head 110 can be installed on various structures for various tests.

Particularly, in addition to the flexibility, the thin film 100 with MEMS probe circuits of the present invention contains a probe supported-spacer 35 as a flexible buffer. Therefore, when used for testing, the MEMS thin film probe head 110 not only bears the pressure transferred from the probe 32, but also provides an adjusting function to compensate the drop height of the probes 32 of the thin film 100. Even if the object to be test is not flat, the MEMS thin film probe head 110 of the present invention can be still operated normally.

The MEMS thin film probe head 110 of the present invention can be used widely, when the test printed circuit board is selected a kind of printed circuit board applicable for flip-chip substrate tests, bare die test, liquid crystal display panel test, or memory test, the MEMS thin film probe head 110 of the present invention shall be applicable for flip-chip substrate test, bare die test, liquid crystal display panel test, or memory test respectively.

For example, the FIG. 3 shows an embodiment of the MEMS thin film probe head 110 of the present invention used for the flip-chip substrate test. This test system includes a set of the MEMS thin film probe head 110 and another set of the lower test device 115 that is based on the thin film 100 with MEMS probe circuits of the present invention. When testing, a flip-chip substrate 63 is inserted into a clamping holder 62 and the probes 32 of the lower test device 115 is electrically connected to upper circuit contacts 27 of the flip-chip substrate 63. Then, the probe 32 of the MEMS thin film probe head 110 is electrically connected to the upper circuit contacts 27 of the flip-chip substrate 63 to form a circuit from the flip-chip substrate 63 to a tester 50 in the test system.

When a circuit is formed in this system, power and signals is transmitted from the tester 50 to the flip-chip substrate 63 by the probe 32 of the test system to test whether the circuit of the flip-chip substrate 63 is good or not.

Figure 11:
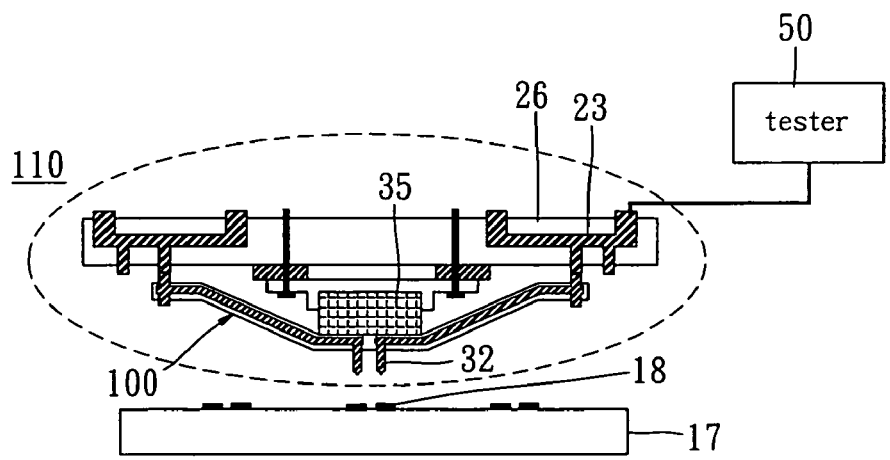
FIG. 11 shows a thin film with MEMS probe circuits of the present invention being applicable to bare die tests.

The FIG. 11 shows an embodiment of the MEMS thin film probe head 110 of the present invention used for the bare die test. The probe 32 of the MEMS thin film probe head 110 is electrically connected to the connection pad 18 of the die 17 to form a circuit from the die 17 to the tester 50.

When a circuit is formed, power and signals can be transmitted from the tester 50 to the die 17 to be tested through the MEMS thin film probe head 110 of the present invention. After being processed via integrated circuit of the die 17, signals will transmit to the tester 50. Products can be determined as good or bad by signals transmitted back to and read by the tester 50.

Although the above mentioned embodiments show some details of the present invention, not all of the embodiments of the present invention are described. Various thin films with MEMS probe circuits or the MEMS thin film probe head and applications that are based on the technologies of the present invention are related to the claims of the present invention.

What is claimed is:

1. A process for producing a thin film with MEMS probe circuits comprising steps of:
    (a) providing a flatted process substrate;
    (b) processing a separable interface to be used in subsequent step (e) on the process substrate provided in step (a);
    (c) forming a probe circuit thin film stacked on a surface of the separable interface processed in step (b) to have the probe circuit thin film be pre-fabricated with various electrical circuits, and plural probes and circuit contacts;
    (d) forming a probe supported-spacer raised on the probe circuit thin film having processed in the step (c);
    (e) separating the probe circuit thin film from the process substrate by destroying the separable interface between the process substrate and the probe circuit thin film; and
    (f) processing subsequent microstructure's working to the probe circuit thin film to obtain a thin film with MEMS probe circuits.

2. The process for producing a thin film with MEMS probe circuits according to claim 1, wherein the flatted process substrate provided in step (a) is made from Ceramic, Silicon, quartz or an Aluminum Alloy.

3. The process for producing a thin film with MEMS probe circuits according to claim 1, wherein the separable interface processed in step (b) is an easily removable material formed on the flatted process substrate provided in step (a).

4. The process for producing a thin film with MEMS probe circuits according to claim 1, wherein the separable interface processed in step (b) is included two layers of polyimide with a bad adhesion in between and stacked on the flatted process substrate provided in step (a).

5. The process for producing a thin film with MEMS probe circuits according to claim 1, wherein the probe circuit thin film formed in step (c) is used with semiconductor process technologies to have the probe circuit thin film including an integral dielectric layer entirely stacked from multi-layered flexible non-conducting dielectric layers made from Polyimide or Silica as a whole, various electrical circuits embedded inside the dielectric layer, and plural probes and circuit contacts with one end embedded into the dielectric layer in connection with the electrical circuits respectively and the other end protruded out of the dielectric layer of the probe circuit thin film.

6. The process for producing a thin film with MEMS probe circuits according to claim 1, wherein the raised probe supported-spacer is made from one of Ceramic, Silicon, Silicide, Glass, Quartz, Rubber, Plastics, Compounds, Epoxy, Polymers, Metal or an alloy thereof, or a stacked Compounds.

7. The process for producing a thin film with MEMS probe circuits according to claim 1, wherein the raised probe supported-spacer formed on the probe circuit thin film in step (d) is used one of the following methods:
    (1) by using adhesion technology to attach a prefabricated probe supported-spacer to the probe circuit thin film;
    (2) by using halftone technology to define a groove formed on the probe circuit thin film and to fill material for a probe supported-spacer into the groove, and then a probe supported-spacer is formed by removing a halftone;
    (3) by using a photoresist material to define a groove formed on the probe circuit thin film and to fill material for a probe supported-spacer into the groove, and then a probe supported-spacer is formed by removing the photoresist material;
    (4) by forming a layer of probe supported-spacer on the probe circuit thin film in advance, and then removing unnecessary parts to obtain a probe supported-spacer formed on the probe circuit thin film;
    (5) by forming a layer of probe supported-spacer on the probe circuit thin film in advance, and until the probe circuit thin film separated from the flatted process substrate removing unnecessary parts to obtain a probe supported-spacer formed on the probe circuit thin film; or
    (6) by directly removing unnecessary parts of a dielectric layer of the probe circuit thin film to obtain a probe supported-spacer formed on the probe circuit thin film.

* * * * *